United States Patent
Noda

(10) Patent No.: US 6,455,904 B1
(45) Date of Patent: Sep. 24, 2002

(54) LOADLESS STATIC RANDOM ACCESS MEMORY DEVICE AND METHOD OF MANUFACTURING SAME

(75) Inventor: Kenji Noda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/531,578

(22) Filed: Mar. 20, 2000

(30) Foreign Application Priority Data

Mar. 23, 1999 (JP) .......................................... 11-078652

(51) Int. Cl.[7] .......................... H01L 29/76; H01L 29/94; H01L 31/062; H01L 31/113; H01L 31/119
(52) U.S. Cl. ........................................ 257/393; 257/903
(58) Field of Search ................................ 257/391, 392, 257/393, 903

(56) References Cited

U.S. PATENT DOCUMENTS

| | | | |
|---|---|---|---|
| 4,907,058 A | * 3/1990 | Sakai | 257/371 |
| 5,079,613 A | * 1/1992 | Sawada et al. | 257/409 |
| 5,373,476 A | * 12/1994 | Jeon | 257/369 |
| 5,592,013 A | * 1/1997 | Honda | 257/392 |
| 5,945,715 A | * 8/1999 | Kuriyama | 257/393 |
| 5,985,709 A | * 11/1999 | Lee et al. | 257/296 |
| 6,044,011 A | * 3/2000 | Marr et al. | 257/903 |
| 6,175,138 B1 | * 1/2001 | Noda | 257/392 |

FOREIGN PATENT DOCUMENTS

| | | | |
|---|---|---|---|
| JP | 2000-12705 | * 12/1998 | |
| JP | P2000-12705 A | 1/2000 | |

* cited by examiner

*Primary Examiner*—Phat X. Cao
(74) *Attorney, Agent, or Firm*—McGinn & Gibb, PLLC

(57) ABSTRACT

A plurality of p wells and a plurality of n wells are formed in a p-type semiconductor substrate having a memory portion and a peripheral circuit portion. Next, a resist pattern is formed on the semiconductor substrate. The resist pattern has apertures which, as viewed from the direction normal to the plane of the semiconductor substrate, approximately coincide with the p wells, wherein the area of aperture openings on the top side of the resist pattern is different from the area of aperture openings on the bottom side of the resist pattern. By using the resist pattern as a mask, p-type ions are injected in a shape approximately the same as that of the aperture opening on the top side or bottom side, whichever has the smaller area. Thereafter, by using the same resist pattern as a mask, n-type ions having enough energy to pass through resist of a predetermined thickness are injected into the p-type semiconductor substrate through areas, located adjacent the apertures in the resist pattern, in which the effective thickness of the resist is small, thereby forming deep n wells so as to cover the p well regions.

20 Claims, 15 Drawing Sheets

LOADLESS STATIC RANDOM ACCESS MEMORY DEVICE AND METHOD OF MANUFACTURING SAME

FIELD OF THE INVENTION

This invention relates to a semiconductor memory device and to a method of manufacturing the same. More particularly, the invention relates to a semiconductor memory device ideal for use in a semiconductor memory comprising an SRAM (Static Random-Access Memory), and to a method of manufacturing the device.

BACKGROUND OF THE INVENTION

Memories well-known in the art and typified by LSI circuits (Large-Scale Integrated Circuits) are classified into SRAMs and DRAMs (Dynamic Random-Access Memories). Almost all of these memories are constituted by MOS (Metal-Oxide Semiconductor) transistors which excel in terms of degree of integration. Further, since SRAMs are advantageous in that they have a higher operating speed than DRAMs, they find wide application for use particularly in memories such as cache memories requiring a high operating speed.

An SRAM basically is constituted by a flip-flop circuit. The flip-flop circuit employs a pair of MOS transistors for drive, in which the input and output electrodes of the transistors are connected together and a load element (pull-up element) is connected to each output electrode. SRAMs are classified broadly into the CMOS (Complementary Metal-Oxide Semiconductor) type, which uses a MOS transistor as the load element of the flip-flop circuit, and the high-resistance load type, which uses a high-resistance thin film such as a polycrystalline silicon as the load element. By connecting MOS transistors for address selection to the pair of output electrodes, one memory cell is constructed.

In the CMOS-type SRAM, one memory cell is composed of six MOS transistors. This is disadvantageous in that the area occupied by one memory cell in the semiconductor substrate is large. By contrast, the high-resistance-type SRAM is such that one memory cell is composed of only four MOS transistors, and the high-resistance thin film can be formed at a position above the MOS transistors. This makes it possible to reduce the cell area. However, since high-resistance load elements comprising polysilicon or the like must be formed in a stacked structure in the limited space available in the memory cell, a complicated memory cell structure is unavoidable. This leads to an increase in the number of manufacturing steps.

SUMMARY OF THE DISCLOSURE

Important factors in the semiconductor memory devices described above are reducing cell size to raise the degree of integration, simplifying the manufacturing process to reduce the labor involved in manufacture, and assuring stability of operation. These challenges give rise to the problems described below.

Problems involving a reduction in cell size will be discussed first. A semiconductor memory device described below is disclosed in applications filed earlier by the present inventor (Japanese Patent Application Nos. 10-109261 and 10-346149 claiming priority of No. 10-109261, now JP-P2000-12705A; the entire disclosures thereof being incorporated herein by reference thereto) and its manufacture employs a method of realizing a reduction in the cell area of the device. The semiconductor memory device includes a pair of address-selecting MOS transistors comprising p-type MOS transistors and a pair of driving MOS transistors comprising n-type MOS transistors formed on a p-type semiconductor substrate. Instead of provision of high-resistance load elements, a threshold-voltage-value adjustment layer is formed in channel regions of the pair of driving MOS transistors.

A threshold-voltage value Vthn of the pair of driving MOS transistors comprising the n-type MOS transistors is set so that the absolute value thereof will be larger than a threshold-voltage value Vthp of the pair of address-selecting MOS transistors comprising the p-type MOS transistors ($|Vthn| \geq |Vthp|$). This is accomplished by forming the threshold-voltage-value adjustment layer in the channel regions of these MOS transistors by adding on a series of new steps (a PR step and an ion-injection step).

The reason for thus setting the threshold voltage value of the MOS transistors is to arrange it so that data that has been stored in the memory cell can be retained without using a third potential, namely a potential other than the power-source potential and ground potential. That is, by satisfying the above-mentioned relationship, leakage current ILp of the address-selecting MOS transistors can be made larger than leakage current ILn of the driving MOS transistors ($ILp \geq ILn$).

As a result, when the power-source potential is applied to the gate electrodes of the address-selecting MOS transistors during standby, loss of electric charge is compensated for by passing a sub-threshold current through these transistors, whereby an output node of the driving transistors can be maintained at the power-source potential. Thus, resultant compensation for loss of charge in the memory cell makes it possible to retain data.

On the other hand, it is known that when Vthn is set too high in comparison with Vthp, cell stability (static noise margin) suffers, as described in the specification of Japanese Patent Application No. 10-346149).

Thus, if a semiconductor memory device in accordance with the earlier applications of the present inventor is used, a reduction in cell size can be achieved. However, because stored data is retained while maintaining the stability of the memory cell by the threshold-voltage-value adjustment layer formed in the channel region of the driving MOS transistors, it is necessary to control the impurity concentration of the channel region of each of the driving MOS transistors. The problem is that manufacture of this device is accompanied by difficulties. This represents a first problem encountered in the course of the investigations toward the present invention.

If alpha rays impinge upon an integrated semiconductor memory device, electron-hole pairs are produced within the MOS transistors, as shown in FIG. 16, and a soft error in which the electric charge invites erroneous circuit operation occurs. A method of preventing such soft error is available and involves forming a transistor having a triple-well structure in which a p-well region is surrounded by an n-well region. In accordance with this method, it is possible to suppress electric charge that flows into the p-well region. On the other hand, the new series of steps (the PR step and ion-injection step) for forming the deep n well region must be added on. This results in a greater number of steps. This a second problem encountered.

Accordingly, an object of the present invention is to provide a semiconductor memory device, and a method of manufacturing the same, in which a deep n-well structure is realized through a single PR step and a threshold-voltage value of n-type transistors within the memory cell is made higher than a threshold-value voltage of n-type transistors in the peripheral circuit.

It is another object of the present invention to improve the operating stability of the semiconductor memory device and effectively suppressing soft error, and in which the threshold-voltage value can be control led freely in the case of a 4-transistor SRAM not having high-resistance load elements.

Further objects of the present invention will become apparent in the entire disclosure.

According to a first aspect of the present invention, the foregoing object is attained by providing a loadless 4-transistor SRAM in which a memory portion and a peripheral circuit portion are disposed on a semiconductor substrate of first conductivity type in which a plurality of wells have been formed, a pair of driving MOS transistors and a pair of address-selecting MOS transistors are formed in the memory portion, and a channel region of the driving MOS transistors is provided with a layer of injected (doped) impurities (impurity-doped layer) of a prescribed concentration for adjusting a threshold-voltage value, wherein a well of a second conductivity type is formed below a well of the memory portion.

According to a second aspect of the present invention, the foregoing object is attained by providing a semiconductor memory device of triple-well structure in which a memory portion and a peripheral circuit portion are disposed on a semiconductor substrate of first conductivity type in which a plurality of wells have been formed, impurity concentration of a well of the first conductivity type of the memory portion is set to be higher than impurity concentration of a well of the first conductivity type of the peripheral circuit portion, and a well of a second conductivity type is provided below a well of the memory portion, wherein the well of the second conductivity type provided below the well of the memory portion is formed so as to cover only the well of the first conductivity type of the memory portion.

According to a third aspect of the present invention, the foregoing object is attained by providing a method of manufacturing a semiconductor memory device in which impurity ions are implanted (doped) using a resist pattern of a prescribed shape, which has been formed on a semiconductor substrate, as a mask, wherein the impurity ions are implanted into the semiconductor substrate upon passing through an area of the resist pattern the thickness whereof is reduced in the direction in which the impurity ions are injected (implanted), the area of reduced effective thickness being adjacent an aperture of the resist pattern.

According to a fourth aspect of the present invention, the foregoing object is attained by providing a method of manufacturing a semiconductor memory device in which impurity ions are injected (implanted) using a resist pattern of a prescribed shape, which has been formed on a semiconductor substrate, as a mask, thereby forming a region of injected (doped) impurities having a shape substantially the same as that of an aperture of the resist pattern, wherein the shape of the region of impurities injected (doped) into the semiconductor substrate is changed by setting a direction along which the impurity ions are injected (implanted) to a predetermined angle.

In accordance with the present invention, adjustment of the impurity concentration of the p well in a memory cell and formation of a deep n well can be carried out with a single resist pattern. This makes it possible to eliminate a PR step for forming a deep n well for the purpose of preventing soft error caused by alpha rays entrant from the outside.

Further, in accordance with the present invention, the reference potential of the p-we II region of the memory cell can be controlled freely in a loadless 4-transistor SRAM. As a result, data that has been stored in the memory cell can be retained in reliable fashion.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

A semiconductor memory device according to the present invention is manufactured as follows in a preferred mode of practicing the invention: First, a plurality of p wells (3 in FIG. 9) and a plurality of n wells (2 in FIG. 9) are formed in a p-type semiconductor substrate having a memory portion and a peripheral circuit portion. Next, a resist pattern (17 in FIG. 9) is formed on the semiconductor substrate. The resist pattern has apertures which, as viewed from the direction normal to the plane of the semiconductor substrate, approximately coincide with the p wells, wherein the area of aperture openings on the top side of the resist pattern is different from the area of aperture openings on the bottom side of the resist pattern. By using the resist pattern as a mask, p-type ions are injected (implanted) in a shape approximately the same as that of the aperture opening on the top side or bottom side, whichever has the smaller area. Thereafter, by using the same resist pattern as a mask, n-type ions having enough energy to pass through resist of a predetermined thickness are injected into the p-type semiconductor substrate through areas, located adjacent the apertures in the resist pattern, in which the effective thickness of the resist is small, thereby forming deep n wells (4 in FIG. 9) so as to cover the p well regions.

Preferred embodiments of the present invention will now be described in further detail with reference to the drawings.

First Embodiment

Figure 1:
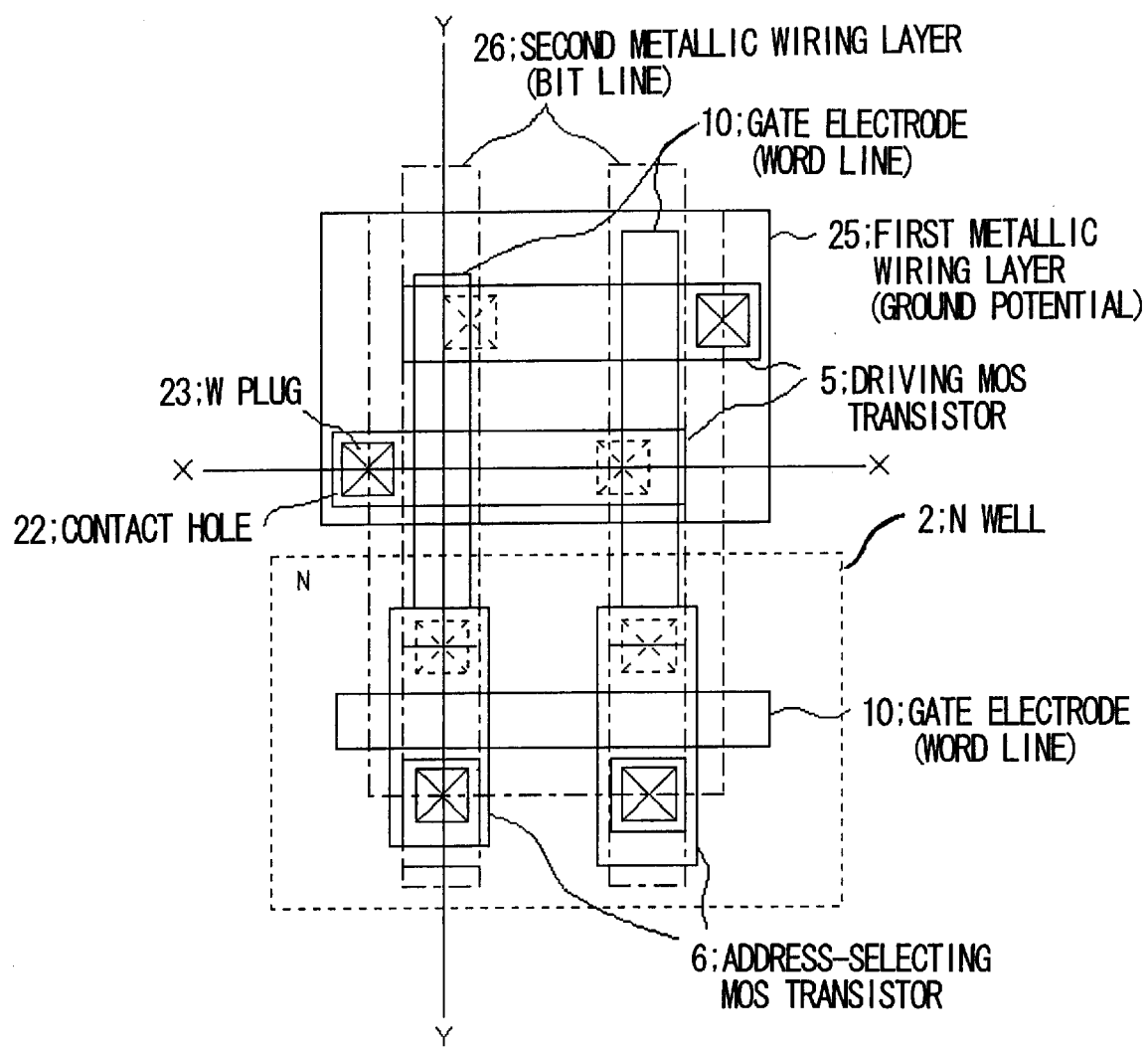
FIG. 1 is a plan view illustrating the construction of a semiconductor memory device according to the present invention.
Figure 2:
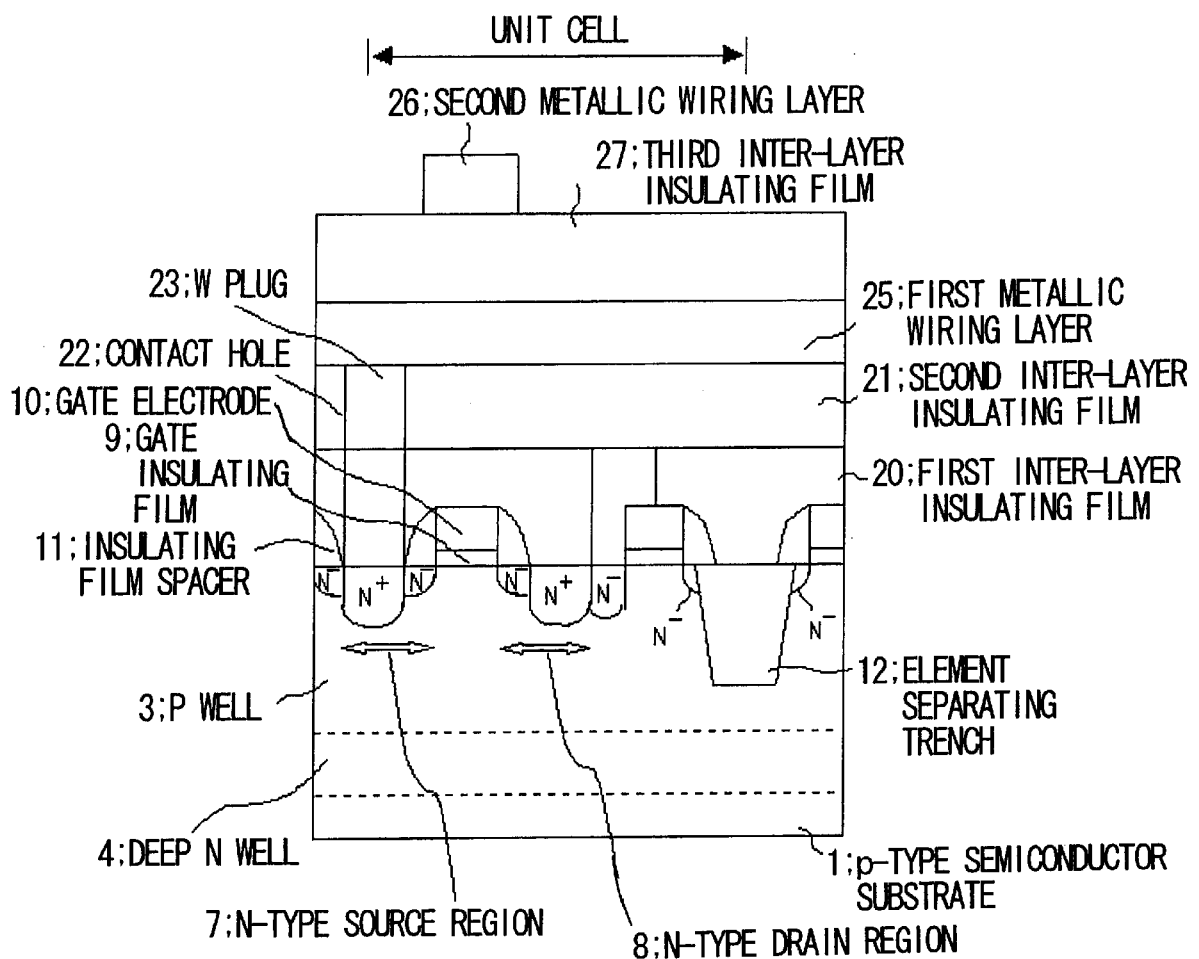
FIG. 2 is a sectional view taken along line X—X of FIG. 1 and showing the structure of the semiconductor memory device according to this invention.
Figure 3:
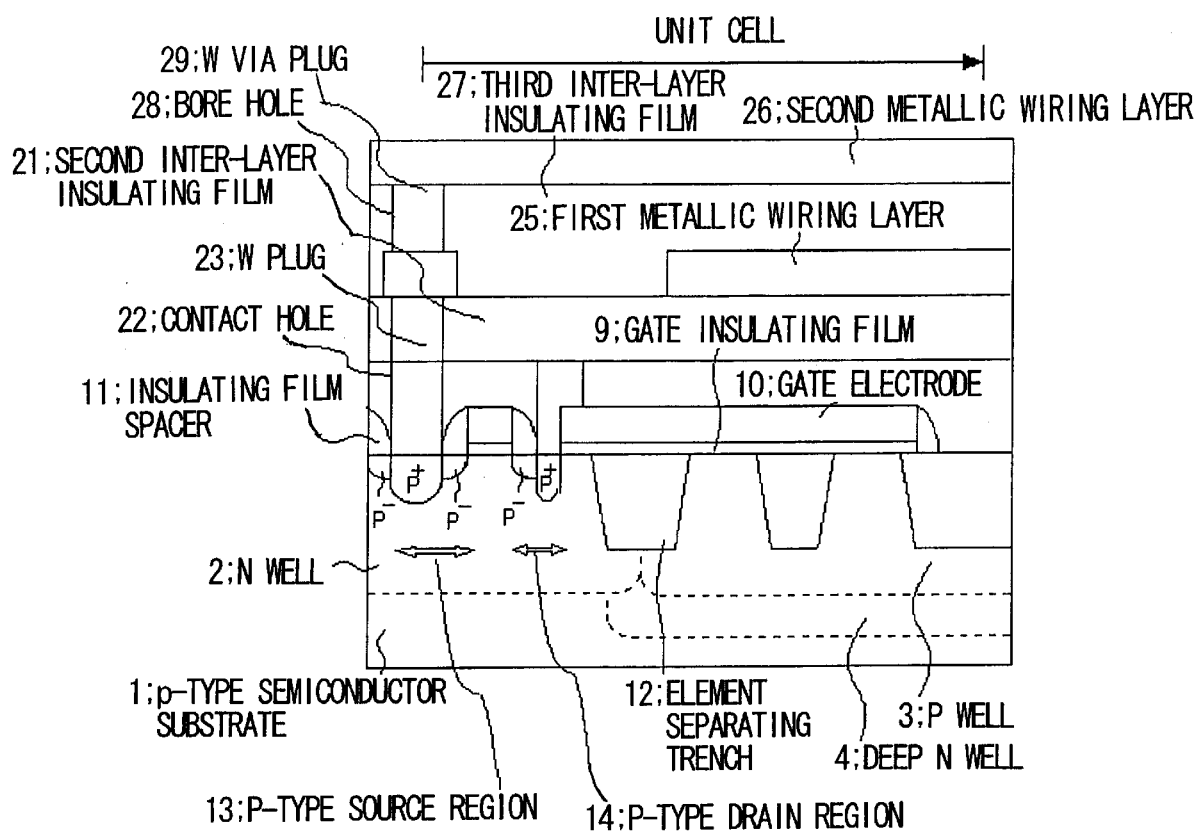
FIG. 3 is a sectional view taken along line Y—Y of FIG. 1 and showing the structure of the semiconductor memory device according to this invention.
Figure 4A:
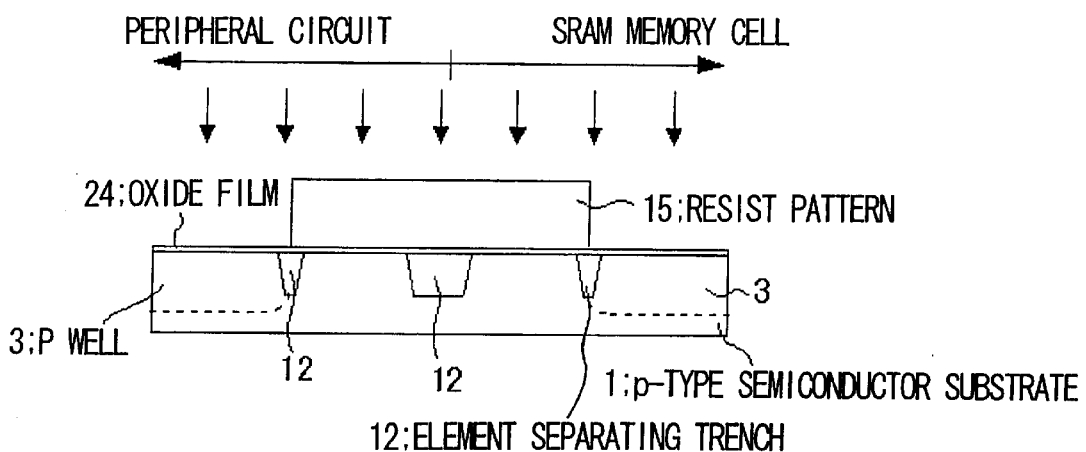
FIGS. 4(a)–4(c) are process diagrams in which a method of manufacturing the semiconductor memory device according to a first embodiment of the present invention is illustrated in the order of the steps.
Figure 5D:
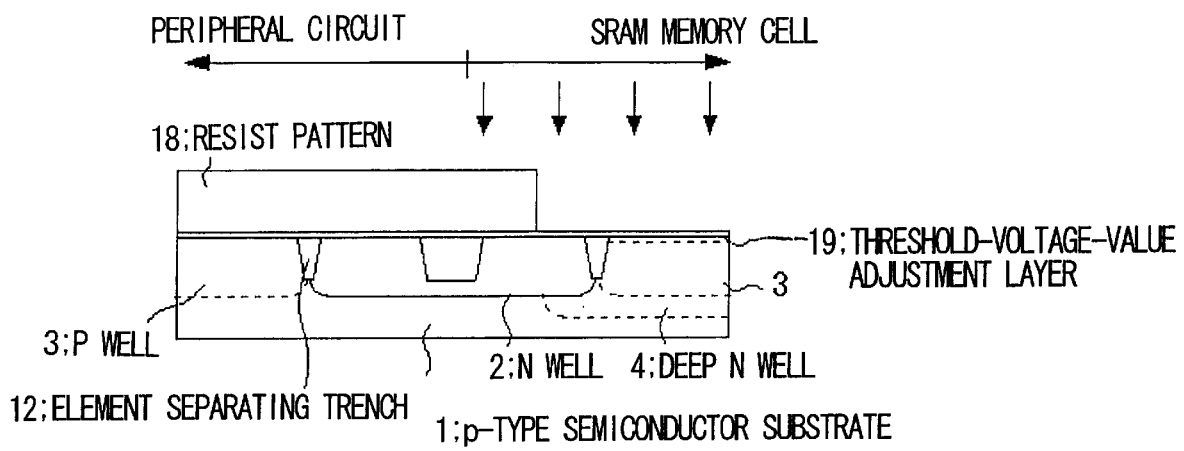
FIGS. 5(d)–5(e) are process diagrams in which a method of manufacturing the semiconductor memory device according to the first embodiment of the present invention is illustrated in the order of the steps.
Figure 5E:
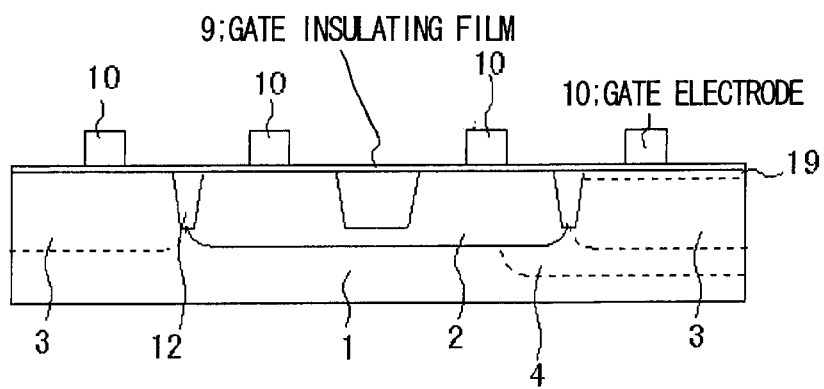
Figure 6F:
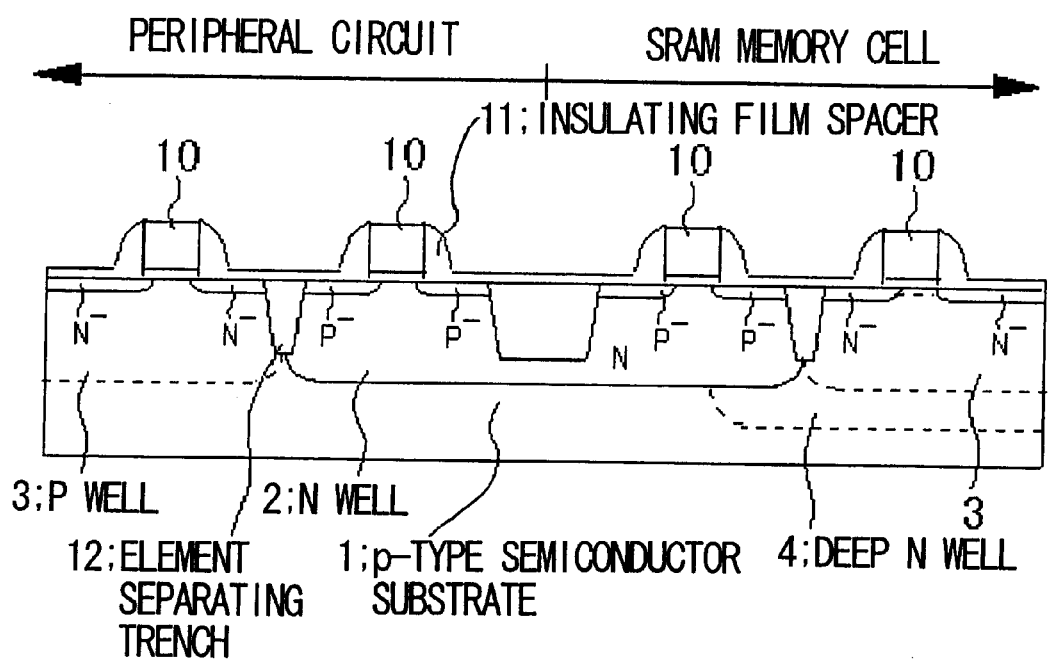
FIGS. 6(f)–6(g) are process diagrams in which a method of manufacturing the semiconductor memory device according to the first embodiment of the present invention is illustrated in the order of the steps.
Figure 6G:
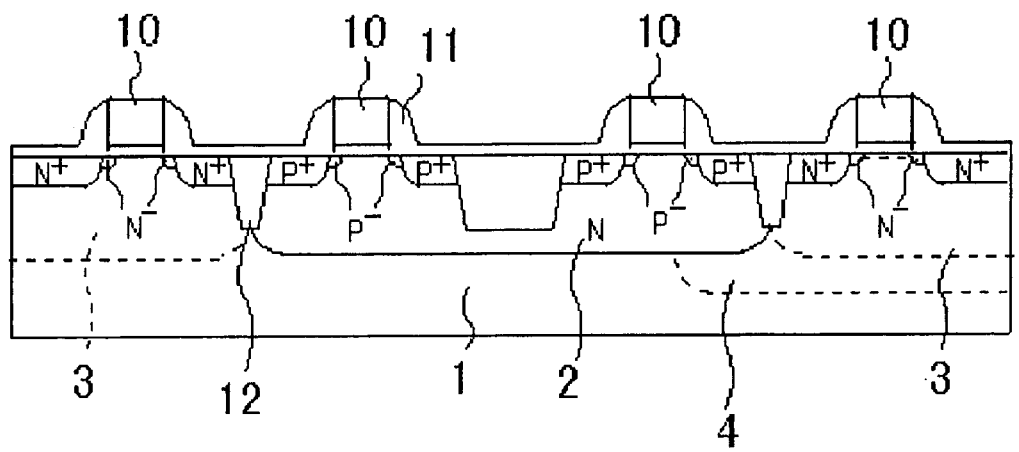

A semiconductor memory device according to first embodiment of the present invention will be described with reference to FIGS. 1 to 8. FIG. 1 is a plan view illustrating the construction of a loadless 4-transistor SRAM according to the first embodiment, FIG. 2 a sectional view taken along line X—X of FIG. 1 and FIG. 3 a sectional view taken along line Y—Y of FIG. 1. FIGS. 4 to 6 are process sectional views in which a method of manufacturing the semiconductor memory device is illustrated in the order of the steps. Furthermore, FIGS. 4(a) to 6(g) illustrate a series of manufacturing steps, which are shown as individual diagrams for convenience sake. FIG. 7 is a diagram useful in describing the steps of FIGS. 4(c) to 5(d), which deal particularly with an SRAM cell area. FIG. 8 is a diagram useful in describing a loadless SRAM formed by the method of this embodiment.

The construction of the semiconductor memory device according to this embodiment will be described first. As depicted in FIGS. 1 to 3, an n well 2 is formed in a p-type semiconductor substrate 1 consisting of, e.g., silicon monocrystal, a pair of address-selecting MOS transistors 6 each comprising a p-type MOS transistor are formed in the n well 2, and a pair of driving MOS transistors 5 each comprising an n-type MOS transistor are formed in the p-type semiconductor substrate 1. The MOS transistors 5 and address-selecting MOS transistors 6 construct a memory cell.

As shown in FIG. 2, each driving MOS transistor 5 has an n-type source region 7 and an n-type drain region 8 each of which comprises an n− region and an n+ region, and a gate electrode 10 is formed, via a gate insulating film 9 such as an oxide film (SiO2), on the surface of the p-type semiconductor substrate 1 between the n-type source region 7 and the n-type drain region 8. The side surfaces of the gate insulating film 9 and gate electrode 10 are covered by an insulating film spacer 11 consisting of an oxide film or the like. A deep n well 4, which is a characterizing feature of this embodiment, is formed below a p well region.

As shown in FIG. 3, each address-selecting MOS transistor 6 has a p-type source region 13 and a p-type drain region 14 each of which comprises a p− region and a p+ region, and a gate electrode 10 is formed, via a gate insulating film 9 such as an oxide film, on the surface of the n-type well 2 between the p-type source region 13 and the p-type drain region 14. The side surfaces of the gate insulating film 9 and gate electrode 10 are covered by an insulating film spacer 11 consisting of an oxide film or the like. A deep n well 4 is formed below the p well region. In FIGS. 2 and 3, only a single MOS transistor is illustrated on account of space considerations.

The gate electrode 10 is extended over the top of the n well 2 to construct a word line, and each n− region and p− region constructs a so-called LDD (Lightly Doped Drain). An element separating trench 12 is formed between a p well 3 forming an n-type MOS transistor and the n well 2 forming a p-type MOS transistor. The element separating trench 12 is formed by imbedding an insulator such as an oxide film into a trench that has been formed in the surface of the p-type semiconductor substrate 1 by etching.

The surface of the gate electrode 10, etc., is covered with a first inter-layer insulating film 20 formed by the CVD method or the like and comprising an oxide film, a BSG (Boron-Silicate Glass) film, a PSG (Phospho-Silicate Glass) film or a BPSG (Boron-Phospo-Silicate Glass) film, etc. The surface of the n-type source region 7 of driving MOS transistor 5 and the surface of the p-type source region 13 of address-selecting MOS transistor 6 are formed to have respective contact holes 22 through the first inter-layer insulating film 20, and a tungsten (W) plug 23 serving as a source electrode is formed within each contact hole 22.

Similarly, the surface of the n-type drain region 8 of driving MOS transistor 5 and the surface of the p-type drain region 14 of address-selecting MOS transistor 6 are formed to have respective contact holes 22 and tungsten plugs 23. The gate electrode 10 is thus connected with the n-type drain region 8 or p-type drain region 14.

The surface of the tungsten plugs 23, etc., is covered with a second inter-layer insulating film 21 formed by the CVD method or the like and comprising an oxide film, a BSG film, a PSG film or a BPSG film, etc. The second inter-layer insulating film 21 is formed to have via holes within which the tungsten plugs 23 are formed. A first metallic wiring layer 25 for providing ground potential is formed on the second inter-layer insulating film 21 so as to contact the tungsten plugs 23 A second metallic wiring layer 26 constructing a bit line is formed on a third inter-layer insulating film 27 so as to contact a tungsten via plug 29.

Next, the method of manufacturing the semiconductor memory device of this embodiment will be described in the order of the process steps with reference to FIGS. 4 to 6.

First, as shown in (a) of FIG. 4, the p-type semiconductor substrate 1 formed to have element separating trenches 12 in advance is provided, and an oxide film 24 having a film thickness of about 15 nm is formed on the substrate by the thermal oxidation method. Next, an area which forms a p-type MOS transistor that will be an address-selecting MOS transistor of a pair thereof in a memory cell and an area which forms a p-type MOS transistor of a peripheral circuit are masked by a resist pattern 15. Then, by using boron (B) as a p-type impurity and an energy of about 120 keV, ion implantation is carried out at a dosage of about $4 \times 10^{12}/cm^2$. This is followed by performing ion implantation using the same impurity, an energy of about 30 keV and at a dosage of about $5 \times 10^{12}/cm^2$, thereby forming the p well 3.

Next, as shown at (b) in FIG. 4, an area which forms an n-type MOS transistor in the p-type semiconductor substrate 1 is masked by a resist pattern 16. Then, by using phosphorous (P) as an n-type impurity and an energy of about 300 keV, ion implantation is carried out at a dosage of about $4 \times 10^{12}/cm^2$. This is followed by performing ion implantation using arsenic (As) as an n-type impurity, an energy of about 100 keV and at a dosage of about $5 \times 10^{12}/cm^2$, thereby forming the n well 2. At this point in time the impurity concentrations of the p well 3 and n well 2 are set in such a manner that the threshold-voltage values of the n-type MOS transistor and p-type MOS transistor formed in the wells 2 and 3 will be approximately equal.

Next, as shown at (c) of FIG. 4, boron is injected (implanted) as a p-type impurity only in the areas which form the pair of driving MOS transistors of the memory cell in p-type semiconductor substrate 1, thereby adjusting the threshold-voltage value of the driving MOS transistors. Thereafter, as shown at (d) of FIG. 5, phosphorous is injected as an n-type impurity into an area somewhat broader than the area of the memory cell to form the deep n well 4 so as to surround the p well. It should be noted that this step is a characterizing feature of this embodiment and will be described later in greater detail.

Next, as shown at (e) of FIG. 5, a polycrystalline silicon film having a film thickness of about 200 nm is formed on the gate insulating film 9 as by the CVD method. This is followed by removing unnecessary portions by well-known photolithography to form the gate electrodes 10 of the n-type and p-type MOS transistors, the n− regions which will serve as the LDD region of the n-type source region and drain region of the n-MOS transistors, and the p− regions which will serve as the LDD region of the p-type source region and drain region of the p-MOS transistors. An insulating film such as an oxide film is formed over the entire surface as by the CVD method. Thereafter, unnecessary portions are removed by photolithography to form the insulating film spacers 11 on the side surfaces of the gate insulating film 9 and gate electrodes 10 [see (f) in FIG. 6].

Next, as shown at (g) in FIG. 6, n+ regions are formed on both sides of the gate electrodes 10 of the n-type MOS transistors and p+ regions are formed on both sides of the gate electrodes 10 of the p-type MOS transistors by ion injection (implantation), whereby there are formed the principal portions of the pair of driving MOS transistors 5 comprising n-type MOS transistors and of the pair of address-selecting MOS transistors 6 comprising p-type MOS transistors.

The loadless 4-transistor SRAM-type semiconductor memory device illustrated in FIGS. 1 to 3 is manufactured by executing successively the formation of the first interlayer insulating films 20, 21, 27 comprising an oxide film, BSG film, PSG film or BPSG film, etc., formation of the contact holes 22, embedding of the tungsten plugs 23 and formation of the metallic wiring layers 25, 26.

Among the steps for manufacturing the loadless 4-transistor SRAM-type semiconductor memory device set forth above, the step [(c) in FIG. 4] for adjusting the impurity concentration of the p well in the memory cell area and the step [(d) in FIG. 5] for forming the deep n well, which are characterizing features of this embodiment, will be described in greater detail with reference to (a) and (b) in FIG. 7.

Figure 7A:
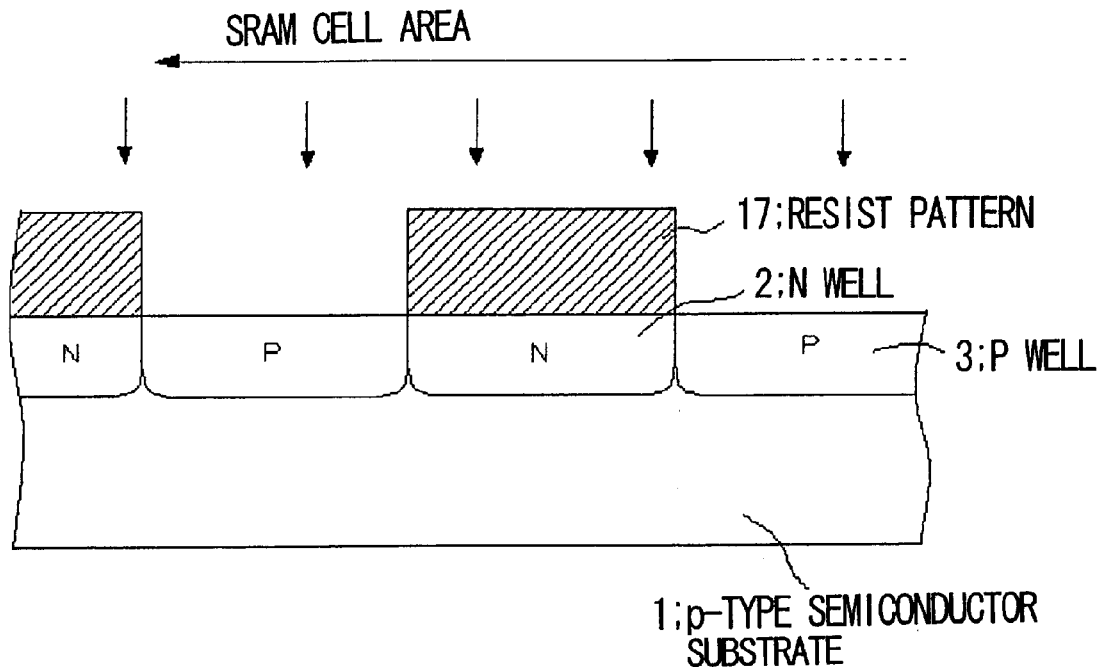
FIGS. 7(a)–7(b) are process diagrams schematically illustrating part of the method of manufacturing the semiconductor memory device according to the first embodiment of the present invention.
Figure 8:
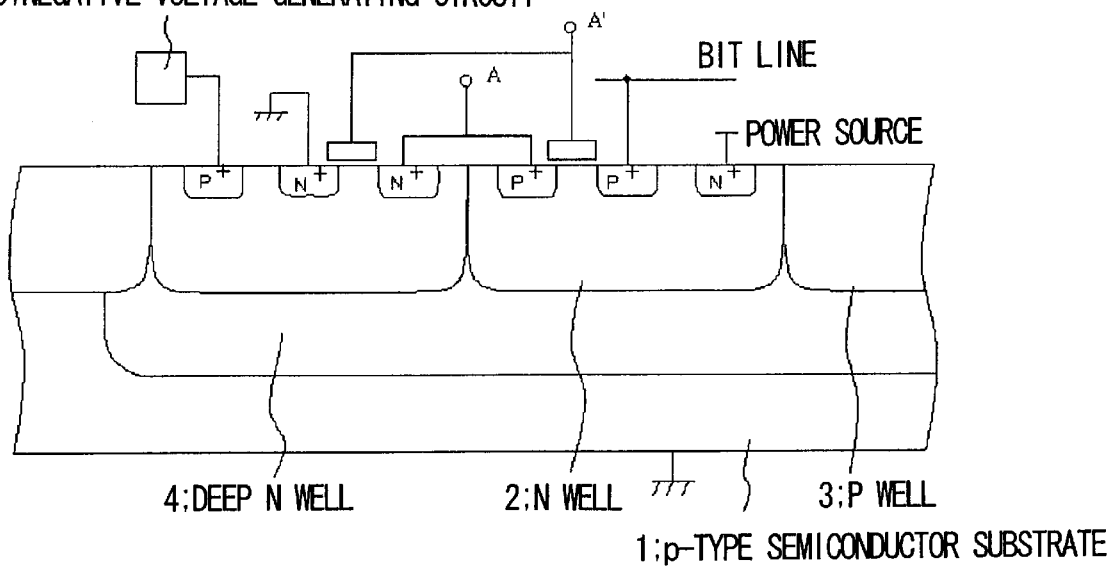
FIG. 8 is a sectional view schematically illustrating the structure of a semiconductor memory device according to the first embodiment of the present invention.

FIG. 7(a) corresponds to FIG. 4(c) and its focus is the memory cell area of the SRAM. As shown in FIG. 7(a), a resist pattern 17 is formed so as to expose only the p well 3 which forms the pair of driving MOS transistors of the memory cell of p-type semiconductor substrate 1. By using the resist pattern 17 as a mask, boron serving as a p-type impurity is injected (implanted) at an energy of about 10–50 keV and at a dosage of about $2 \times 10^{12}/cm^2$, with the impurity concentration of the p well 3 of the driving MOS transistors being set higher than that of the p well of the peripheral circuit to adjust the threshold-voltage value of the driving MOS transistors.

Figure 7B:
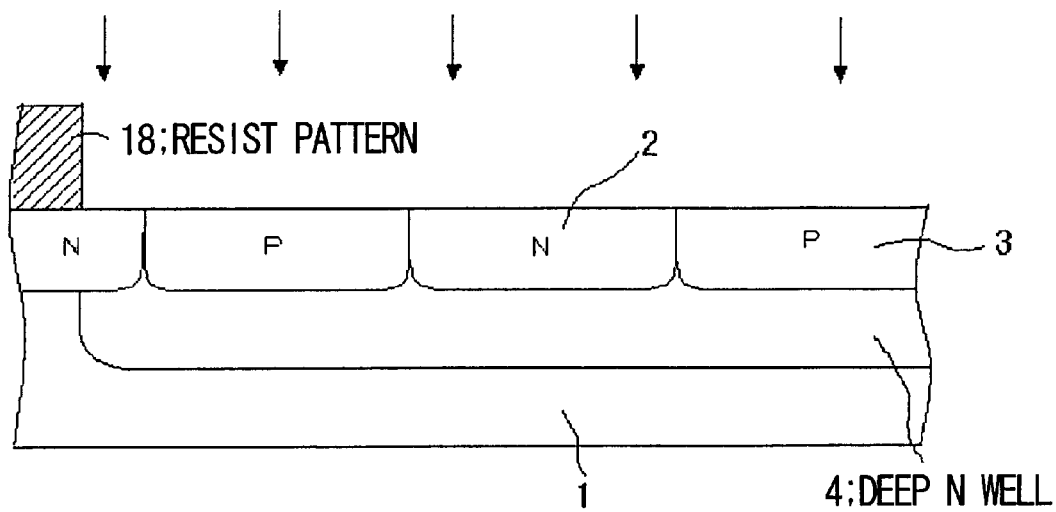

Next, as shown in FIG. 7(b) corresponding to FIG. 5(d), a resist pattern 18 is formed so as to expose an area that is slightly broader than the overall memory cell area of the p-type semiconductor substrate 1. By using the resist pattern 18 as a mask, phosphorous serving as an n-type impurity is injected at an energy of about 600–1500 keV and at a dosage of about $1 \times 10^{13}/cm^2$, thereby forming the deep n well 4 so as to surround the overall are a of the memory cell. In other words, this embodiment is characterized in that the area of the memory cell is completely isolated from the p-type semiconductor substrate 1 by forming the deep n well 4 as the entire layer under lying the memory cell area of the load less 4-transistor SRAM.

In the conventional loadless 4-transistor SRAM, the channel region of the driving MOS transistors 5 is provided with a threshold-voltage-value adjustment layer 19 to accurately control the impurity concentration, thereby suppressing malfunctions. However, with the loadless 4-transistor SRAM formed according to the method of this embodiment, the p well region of the driving MOS transistors 5 is isolated from the p-type semiconductor substrate 1 by the deep n well 4. Consequently, as shown in FIG. 8, the reference potential of the p well region can be controlled by an externally provided negative-voltage generating circuit 30. This makes it possible to set the reference voltage of the p well region to any negative potential without forming the accurate threshold-voltage-value adjustment layer 19 of as in the prior art. In an SRAM devoid of high-resistance load elements, data that has been stored in the memory cell can be retained reliably without causing any decline in static noise margin.

More specifically, by satisfying the relation mentioned earlier, leakage current ILp of the address-selecting MOS transistors 6 can be made larger than leakage current ILn of the driving MOS transistors 5 (ILp≧ILn). As a result, when power-source potential is applied to the gate electrodes of the address-selecting MOS transistors 6 during standby, loss of electric charge is compensated for by passing a subthreshold current through the transistors 6. This means that the output node of the driving MOS transistors 5 can be held at the power-source potential. Since loss of electric charge in the memory cell can be compensated for as a result, data can be retained.

Further, by forming the deep n well 4 so as to surround the p well region of the driving MOS transistors 5, electric charge that is produced by alpha rays etc. entrant from the outside can be absorbed by the deep n well. This makes it possible to avoid the problem of soft error, etc.

Second Embodiment

Figure 9A:
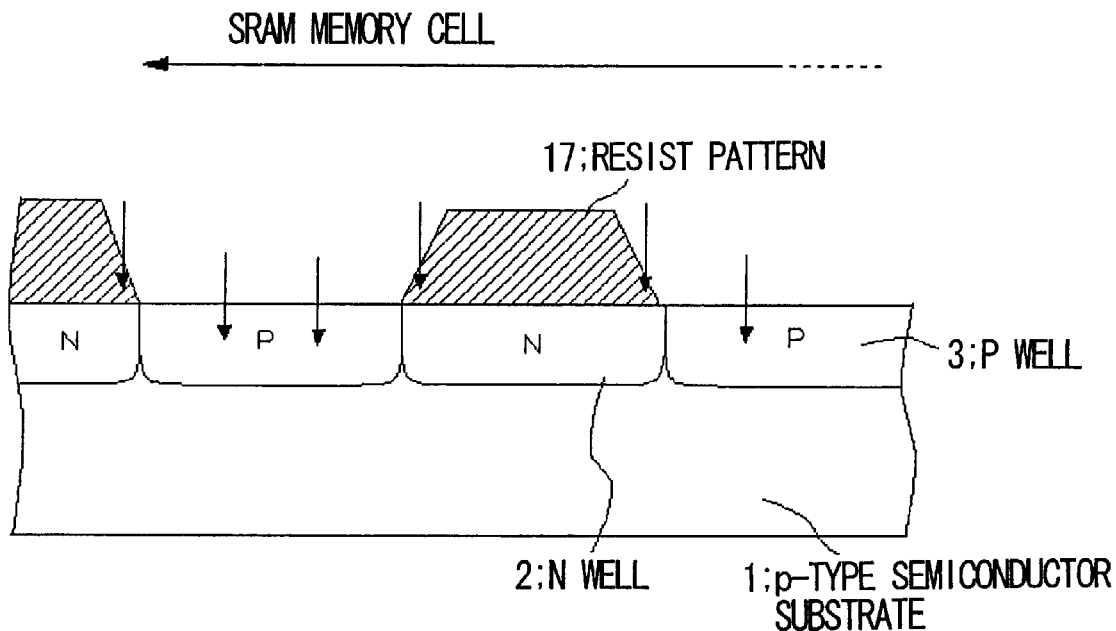
FIGS. 9(a)–9(b) are process sectional views schematically illustrating part of a method of manufacturing the semiconductor memory device according to the second embodiment of the present invention.
Figure 9B:
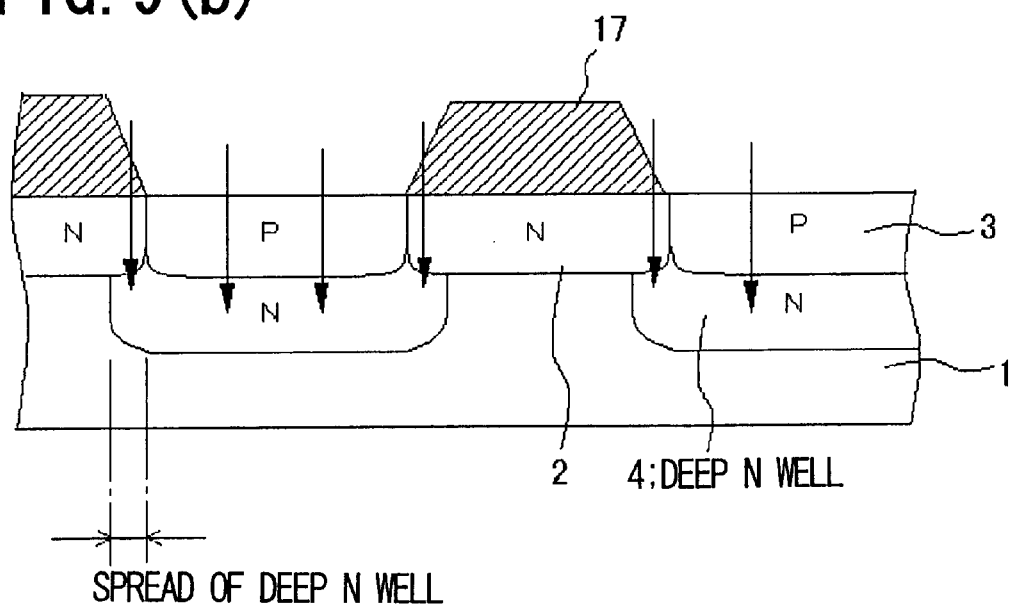
Figure 10:
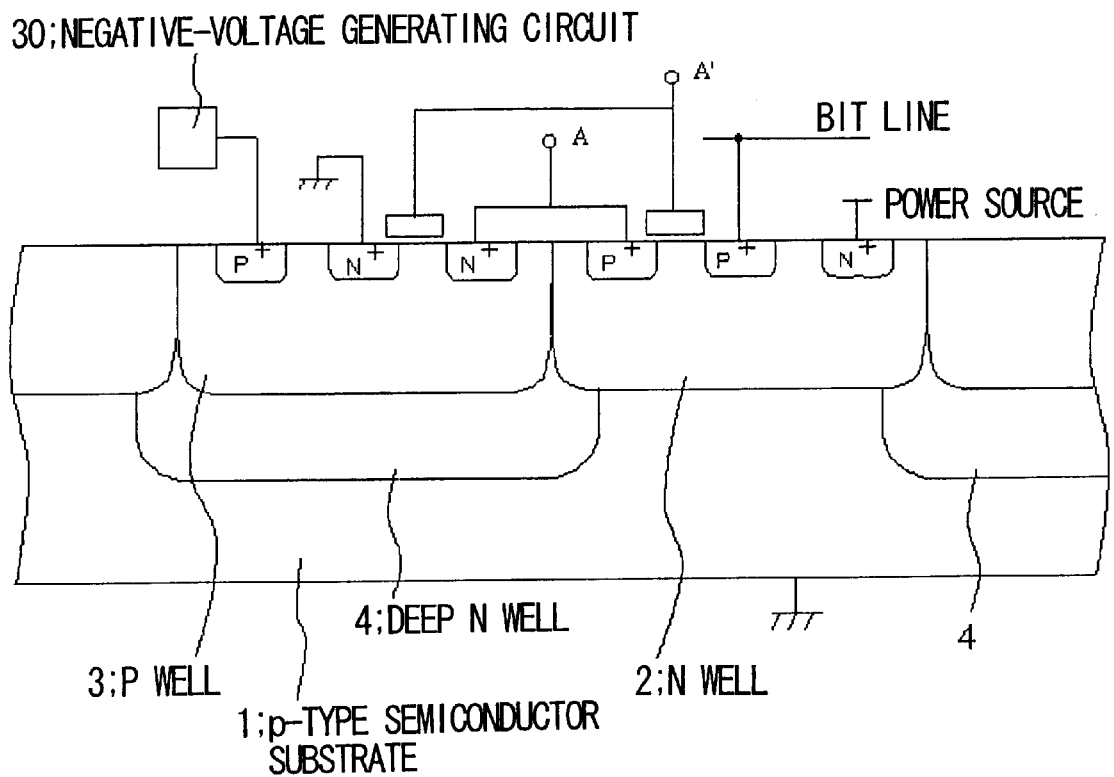
FIG. 10 is a sectional view schematically illustrating the structure of the semiconductor memory device according to the second embodiment of the present invention.
Figure 11:
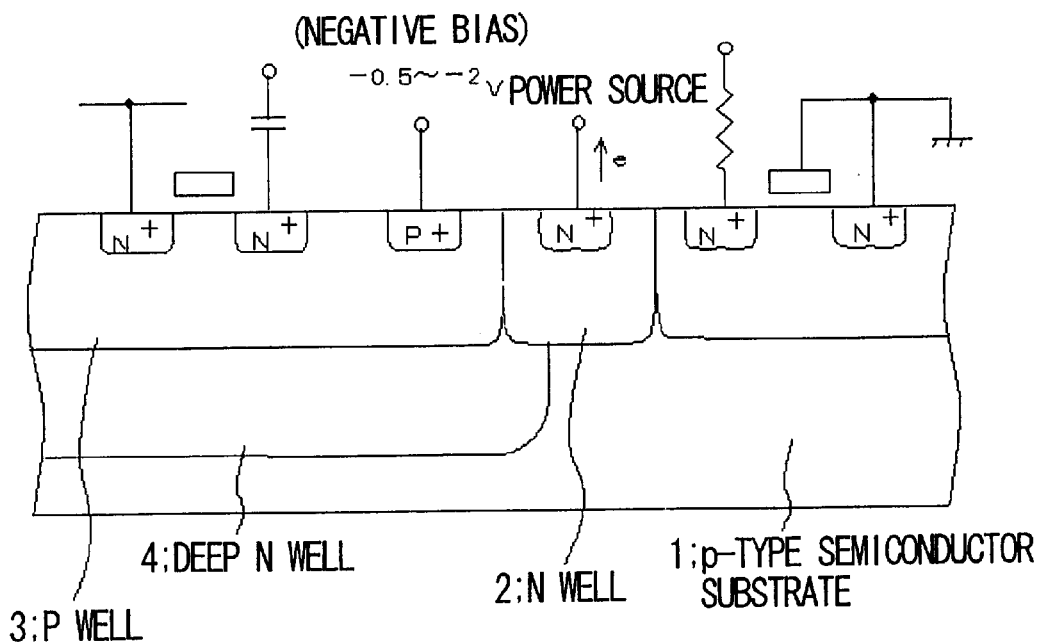
FIG. 11 is a sectional view schematically illustrating structure in a case where the present invention is applied to a DRAM.

A semiconductor memory device according to a second embodiment of the present invention will be described with reference to FIGS. 9 to 11. FIG. 9 is a process sectional view schematically illustrating part of a method of manufacturing the semiconductor memory device according to this embodiment. FIG. 10 is a sectional view schematically illustrating the structure of the semiconductor memory device according to this embodiment, and FIG. 11 is a sectional view in a case where the method of forming the deep n well of this embodiment is applied to a DRAM. It should be noted that this embodiment differs from the first embodiment in that the deep n well of this embodiment is formed so as to cover only that part of the memory cell underlying the p well. Other steps of the manufacturing process and other components are the same as those of the first embodiment.

Figure 4B:
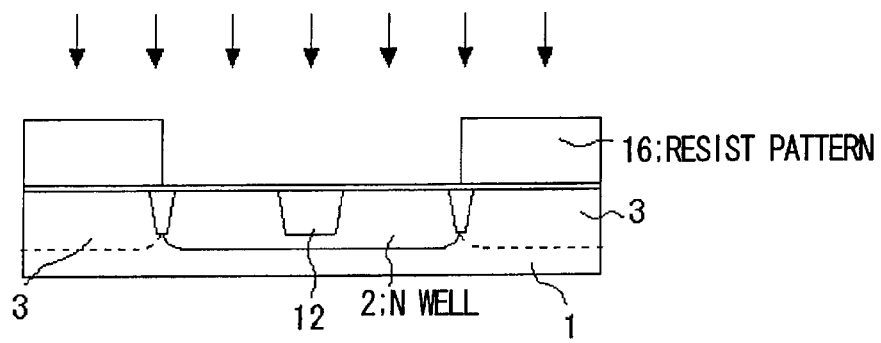
Figure 4C:
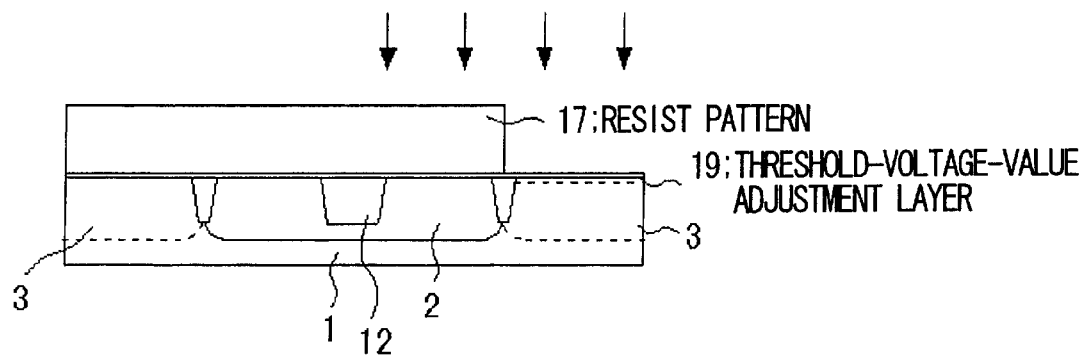

With regard to the process for forming the deep n well characterizing this embodiment, steps up to the formation of the p well and n well in FIG. 4(b) are carried out through a method similar to that of the first embodiment described above, after which the resist pattern 17 is formed so as to expose only the p well region, as illustrated in (a) of FIG. 9. The characterizing feature of this embodiment is that the resist pattern 17 is formed to have a tapered shape so that it may be used as is in the formation of the deep n well, which is the next step.

The process for forming the resist pattern 17 is as follows: Use is made of a resist such as THMR-ip2690 (manufactured by Tokyo Ohka Kogyo Co., Ltd.). First, the entire surface of the substrate is coated uniformly with the resist to a film thickness on the order of 2.5 $\mu$m and the result is baked. This is followed by irradiation with light of wavelength 365 nm, using a reticle on which a prescribed pattern has been formed, in such a manner that the total quantity of light obtained is on the order of 200 mJ. Development is then carried out longer in time than usual. Since these conditions are such that the amount of exposure is greater or the exposure time longer in comparison with the usual PR conditions, it is possible to form a resist pattern the edge of the top portion of which recedes. As a result, the resist pattern has a tapered shape.

By using the resist pattern 17 thus formed, boron ion is injected as a p-type impurity at an energy of about 10–50 keV and at a dosage of about $2 \times 10^{12}/cm^2$, with the impurity concentration of the p well of the memory cell being set higher than that of the peripheral circuit. However, since the ion energy of boron is low, the ions that impinge upon the resist pattern 17 lose energy within the resist pattern and are not injected (implanted) into the under lying p-type semiconductor substrate 1. In other words, the injection of the impurity ions is carried out in conformity with the shape of the openings of the apertures in the lower part of the resist pattern 17.

Next, by using the same resist pattern 17, phosphorous serving as an n-type impurity is injected at an energy of about 600–1500 keV and at a dosage of about $1 \times 10^{13}/cm^2$, thereby forming the deep n well 4 only beneath the p well 3 of the memory cell. Since the ion energy of phosphorous is high in this injection step, some of the ions that impinge upon the tapered portions walls of the resist pattern 17 pass through the resist pattern 17 and are injected into the p-type semiconductor substrate 1 underlying the pattern.

In accordance with experiments conducted by the present inventor, under the resist-pattern formation conditions and ion injection conditions set forth above, the phosphorous ions pass through a resist having a thickness on the order of 1 to 2 $\mu$m. It has been confirmed that, as a consequence, when the resist pattern 17 is formed in such a manner that the tapered sides of the resist pattern define an angle of about 85° with respect to the plane of the substrate, the ions are injected into an area that spreads beyond the aperture openings in the lower portion of the resist pattern by about 0.1 $\mu$m, as depicted at (b) of FIG. 9. Further, in a case where the injected ions are diffused by subsequent steps, this spread of the deep n well 4 becomes 0.1 to 1 $\mu$m.

Accordingly, it is possible to adjust the impurity concentration of the p well 3 of the memory cell and to form the deep n well 4 without providing separate resist patterns for injecting the p well 3 of the memory cell and for forming the deep n well 4, as is required in the prior art. In other words, in the injection of the low-ion-energy ions for adjusting the impurity concentration of the p well 3, the ions cannot pass through the resist pattern 17. As a consequence, the ions are injected in conformity with the shape of the openings of the apertures in the lower part of the resist pattern 17. On the other hand, in the injection of the high-ion-energy ions for forming the deep n well 4, the ions that impinge upon the side surfaces of the resist pattern 17 pass through the resist pattern 17 and reach the p-type semiconductor substrate 1 This makes it possible to form the deep n well 4 in such a shape that it covers the p well 3 up to a point somewhat beyond the aperture opening in the lower part of the resist pattern 17. As a result, in the manufacture of a semiconductor memory device which includes both a step for setting the impurity concentration of the p well 3 of the memory cell higher than that of the peripheral circuit and a step for forming the deep n well 4, it is possible to eliminate a resist-pattern formation step.

In a case where the deep n well 4 is formed by the method described above, the p well 3 of the driving MOS transistor 5 is isolated from the p-type semiconductor substrate 1 by the deep n well 4, as shown in FIG. 10, in a manner similar to that of the first embodiment. Consequently, the reference potential of the p well region can be control led by the externally provided negative-voltage generating circuit 30. This makes it possible to set the reference voltage of the p well region freely without providing the threshold-voltage-value adjustment layer 19 required in the prior art. In an SRAM which does not employ high-resistance load elements, data that has been stored in the memory cell can be retained reliably.

Unlike the first embodiment, the deep n well 4 is not formed below the n well 2 of the memory cell. This makes it possible to prevent a problem in which the effects of soft error are intensified by enlarging the effective thickness of the n well 2. Furthermore, since boron is additionally injected (doped) into the n-type transistor region within the memory cell, it is possible to prevent a deterioration in short-channel characteristic due to application of excessive negative bias.

This embodiment is not limited to the arrangement described above and it should be obvious that it is applicable also to a 6-transistor SRAM or to a DRAM shown in FIG. 11. It will suffice if the semiconductor memory device is one having a memory portion and a peripheral circuit portion as its components and the process of manufacture thereof includes an ion injection (implantation) step for setting the impurity concentration of the p well, which is used in the driving transistors, higher than that of the peripheral circuit in order to improve cell stability.

Third Embodiment

A semiconductor memory device according to a third embodiment of the present invention will be described with reference to FIG. 12, which is a process sectional view schematically illustrating part of a method of manufacturing a semiconductor memory device according to the third embodiment. This embodiment differs from the second embodiment in that the shape of the resist pattern in this embodiment is the usual rectangular shape, the characterizing feature being that the injection (implantation) angle of ions in the step for forming the deep n well is set to an angle less than 90°. Other steps of the manufacturing process and other components are the same as those of the second embodiment.

Figure 12A:
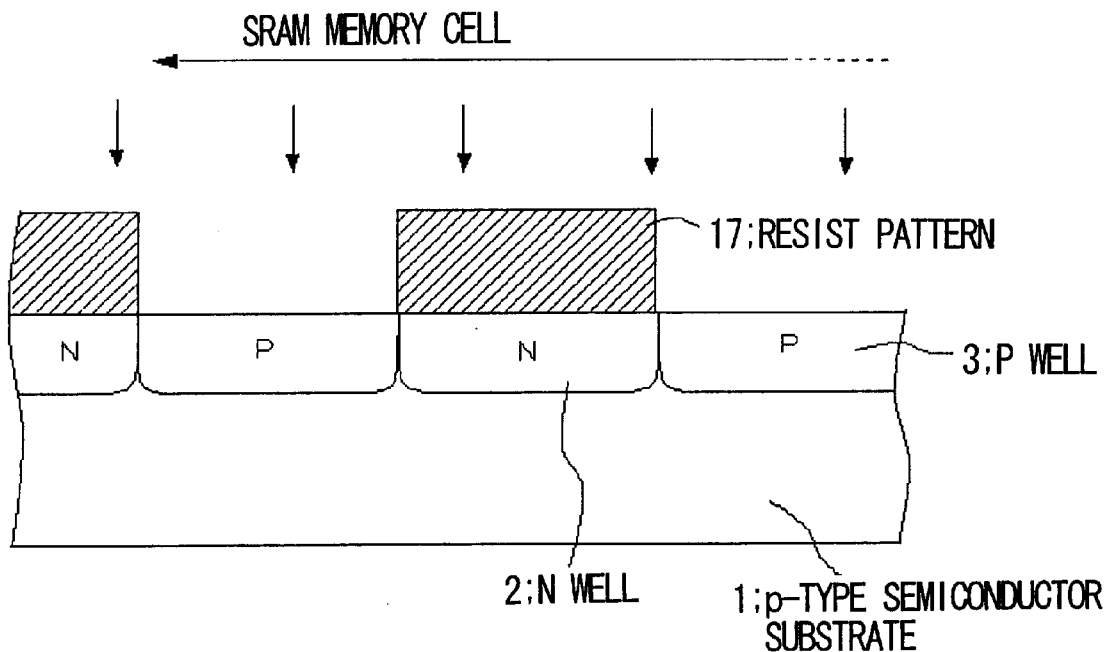
FIGS. 12(a)–12(b) are process sectional views schematically illustrating part of a method of manufacturing a semiconductor memory device according to a third embodiment of the present invention.

With regard to the process for forming the deep n well characterizing this embodiment, which will be described with reference to FIG. 12, steps up to the well formation of FIG. 4(b) are carried out through a method similar to that of the first embodiment described above, after which the resist pattern 17 is formed so as to expose only the p well 3 of the memory cell as illustrated in FIG. 12(a). In this embodiment, this resist pattern is used also in the formation of the deep n well of the next step but, since the shape of the resist pattern is the usual rectangular shape, the resist pattern is formed under the usual conditions.

As shown in FIG. 12(a), by using the resist pattern 17, boron ion is injected as a p-type impurity at an energy of about 10–500 keV and at a dosage of about $2\times10^{12}/cm^2$, with the impurity concentration of the p well 3 of the memory cell being set higher than that of the peripheral circuit. However, since the ion energy of boron is low, the ions that impinge upon the resist pattern 17 lose energy within the resist pattern and are not injected into the underlying p-type semiconductor substrate 1. In other words, the injection of the impurity is carried out in conformity with the shape of the apertures of the resist pattern 17.

Figure 12B:
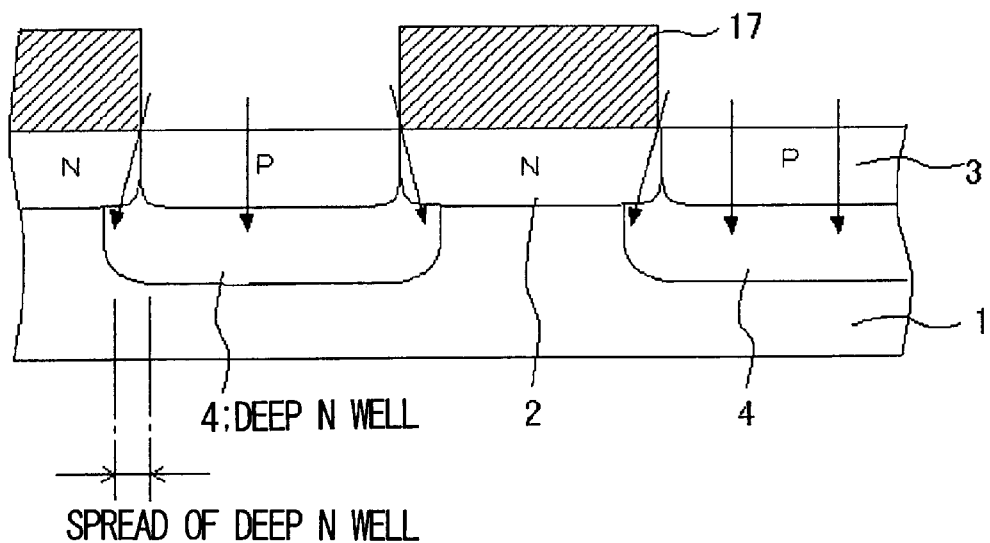

Next, by using the same resist pattern 17, as shown at FIG. 12(b), phosphorous serving as an n-type impurity is injected at an energy of about 600–1500 keV and at a dosage of about $1\times10^{13}/cm^2$, thereby forming the deep n well 4 beneath the p well 3 of the memory cell. In this injection step, however, the ion injection angle is set to be about 5° with respect to the normal to the plane of the substrate. When injection is performed in this fashion, the ions that impinge upon the lower ends of the apertures in the resist pattern proceed into the p-type semiconductor substrate 1 at an inclined angle. As a consequence, the ions can be injected into an area that is broader than the shape of the apertures. In addition, since the phosphorous ion energy is high, some of the ions that impinge obliquely upon the side surfaces of the resist pattern 17 pass through the resist pattern 17 and are injected into the p-type semiconductor substrate 1 underlying the pattern.

Under the resist formation conditions and ion injection conditions set forth above, the ions pass through a resist having a thickness on the order of 1 to 2 µm just as in the second embodiment described above. As a consequence, in a case where the ions are injected in such a manner that the ion injection angle is inclined by about 5° from the direction of the normal to the substrate plane, the ions are injected into an area that spreads (extends) beyond the aperture openings in the lower portion of the resist pattern 17 by about 0.1 µm, as depicted at FIG. 12(b).

Accordingly, in a manner similar to that of the second embodiment described above, the same resist pattern 17 is used in the injection of ions for adjusting the impurity concentration of the p well 3, wherein the injection of ions is carried out in conformity with the shape of the aperture openings in the lower part of the resist pattern 17. On the other hand, in the injection of ions for forming the deep n well 4, the ions that impinge upon the lower ends of the apertures in the resist pattern proceed into the p-type semiconductor substrate 1 at an incline and some of the ions that impinge upon the side surfaces of the resist pattern 17 pass through the resist pattern 17 and reach the p-type semiconductor substrate 1. This makes it possible to form the deep n well 4 in such a shape that it covers the p well 3 up to a point somewhat beyond the opening of aperture in the lower part of the resist pattern 17. As a result, it is possible to eliminate a resist-pattern formation step.

In a case where the deep n well 4 is formed by the method described above, the p-well region of the driving MOS transistor 5 is isolated from the p-type semiconductor substrate 1 by the deep n well 4 in a manner similar to that of the second embodiment. Consequently, the reference potential of the p well region can be control led by the externally provided negative-voltage generating circuit 30. As a result, in a loadless 4-transistor SRAM, data that has been stored in the memory cell can be retained reliably. Further, in semiconductor memory devices such as SRAMs and DRAMs in general, since the deep n well 4 is not formed below the n well of the memory cell, it is possible to prevent a problem in which the effects of soft error are intensified by enlarging the effective thickness of the n well 2.

Fourth Embodiment

A semiconductor memory device according to a fourth embodiment of the present invention will be described with reference to FIG. 13, which is a process sectional view schematically illustrating part of a method of manufacturing a semiconductor memory device according to the fourth embodiment. This embodiment differs from the second embodiment in the shape of the resist pattern; other steps of the manufacturing process and other components are the same as those of the first and second embodiments.

Figure 13A:
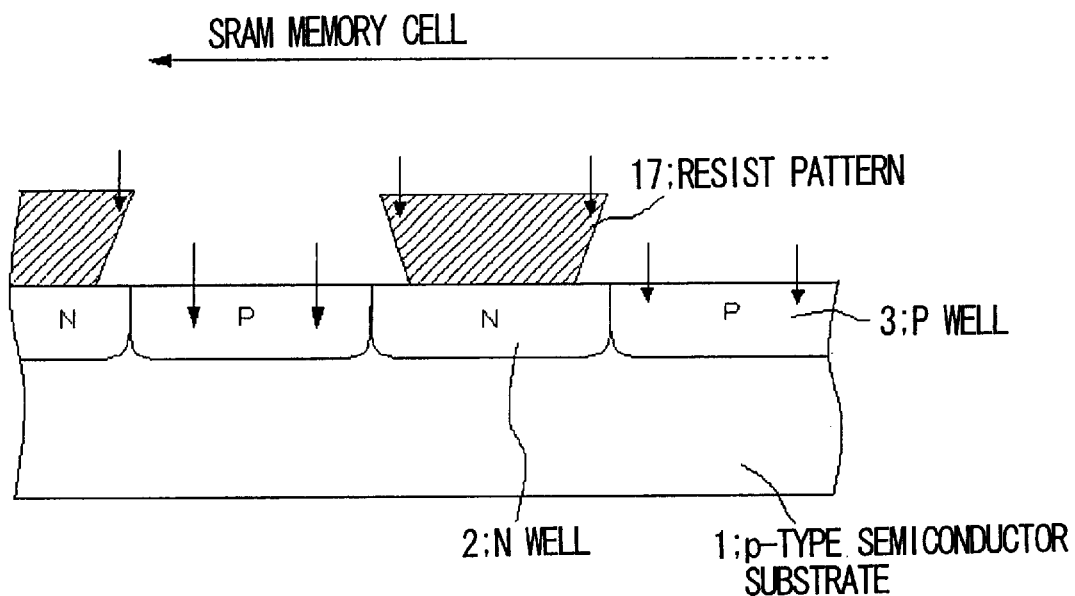
FIGS. 13(a)–13(b) are process sectional views schematically illustrating part of a method of manufacturing a semiconductor memory device according to a fourth embodiment of the present invention.

With regard to the process for forming the deep n well characterizing this embodiment, which will be described with reference to FIG. 13, steps up to the well formation of FIG. 4(b) are carried out through a method similar to that of the first embodiment described above, after which the resist pattern 17 is formed in such a manner that the p well 3 of the memory cell will coincide with the opening of the aperture in the upper part (edge) of the resist pattern as viewed from the normal to the plane of the p-type semiconductor substrate 1, as shown in FIG. 13(a). In this embodiment, the shape of the resist pattern is such that the aperture opening at the top is smaller than the aperture opening at the bottom. In other words, the resist pattern is formed so as to have an inverted tapered shape.

The process for forming the resist pattern 17 is as follows: Use is made of a resist such as AZ5214E (manufactured by Hoechst Japan Ltd.). First, the entire surface of the substrate is coated uniformly with the resist to a film thickness on the order of 2.5 µm and the result is baked (cured). This is followed by performing exposure using a reticle on which a prescribed pattern has been formed. After baking is performed a second time, the entire surface is irradiated with light and then developed, whereupon there is formed a resist pattern 17 the edge of the bottom portion of which recedes as compared to the edge of the upper part. As a result, the resist pattern 17 has an inverted tapered Boron ion is injected as a p-type impurity under conditions similar to those of the foregoing embodiments using the resist pattern 17 thus formed. Since the ion energy of boron is low, the ions that impinge upon the resist pattern 17 lose energy within the resist pattern and are not injected into the underlying p-type semiconductor substrate 1. Thus the injection of the impurity is carried out in conformity with the shape of the openings of the apertures in the upper part of the resist pattern 17.

Figure 13B:
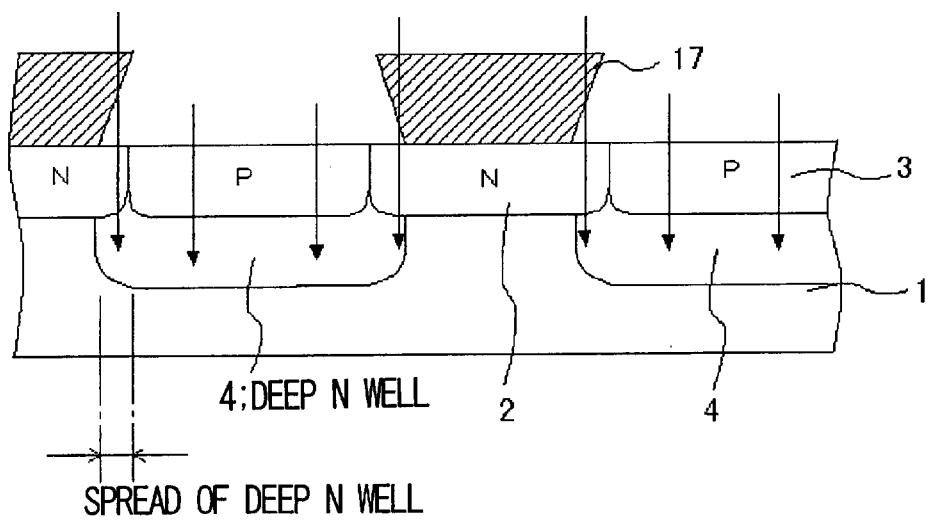

Next, phosphorous serving as an n-type impurity is injected using the same resist pattern 17, as shown in FIG. 13(b). Since the phosphorous ion energy is high in this injection step, some of the ions that impinge upon the end of the aperture in the resist pattern 17 pass through the resist pattern 17 and are injected into the p-type semiconductor substrate 1 underlying the resist pattern.

Accordingly, in a manner similar to that of the foregoing embodiments described above, the same resist pattern is used in the injection of ions for the p well 3 and in the injection of ions for the deep n well 4, thereby making it possible to eliminate a resist-pattern formation step. Further, in the memory cell of a loadless 4-transistor SRAM, the reference potential can be set to an optimum value by the externally provided negative-voltage generating circuit 30, as a result of which the data in the memory cell can be retained reliably. With regard to semiconductor memory devices in general, there is no increase in the effective thickness of the n well, thus making it possible to mitigate the effects of soft error in the n well region.

Further, by employing the resist pattern having a shape in accordance with this embodiment, joint use can be made of a method of changing the ion injection angle when the deep n well 4 is formed, as described in the third embodiment. In such case the impurity can be injected into an area broader than the area of additional injection of the p well 3 even though the ions injected for formation of the deep n well 4 do not pass through the resist. As a result, the energy of ion injection may be changed freely so that the thickness of the deep n well 4 can be changed at will.

Fifth Embodiment

A semiconductor memory device according to a fifth embodiment of the present invention will be described with reference to FIGS. 14 and 15, which are process sectional views schematically illustrating part of a method of manufacturing a semiconductor memory device according to this embodiment. This embodiment differs from the fourth embodiment only in that shape of the resist pattern is different; other steps of the manufacturing process and other components are the same as those of the first and second embodiments.

With regard to the process for forming the deep n well characterizing this embodiment, which will be described with reference to FIGS. 14 and 15, steps up to the well formation of FIG. 4(b) are carried out through a method similar to that of the first embodiment described above, after which the resist pattern 17 is formed in such a manner that the p well 3 will coincide with the opening of the aperture in the upper part of the resist pattern 17 as viewed from the normal to the plane of the p-type semiconductor substrate 1, as shown at (a) in FIG. 14. In this embodiment, the shape of the resist pattern 17 is such that the uppermost part (layer) of the resist is extended outward into the aperture. In other words, the resist pattern is formed so as to have shape that includes a canopy overhanging part of the aperture.

The process for forming the resist pattern 17 is as follows: Use is made of a resist such as THMR-ip2690 (manufactured by Tokyo Ohka Kogyo Co., Ltd.). First, the entire surface of the substrate is coated uniformly with the resist to a film thickness on the order of 2.5 μm and the result is baked. This is followed by performing exposure under the usual conditions using a reticle on which a prescribed pattern has been formed. The p-type semiconductor substrate 1 is then immersed in an agent such as monochlorobenzene to change the properties of the resist surface, after which baking is performed again. When exposure is carried out, there is formed a resist pattern 17 in which the edge of the uppermost layer of the pattern projects outwardly in the manner of a canopy.

Boron ion is additionally injected as a p-type impurity under conditions similar to those of the foregoing embodiments using the resist pattern 17 thus formed. Since the ion energy of boron is low, the ions that impinge upon the resist pattern 17 are not injected into the underlying p-type semiconductor substrate 1. Thus the injection of the impurity is carried out in conformity with the shape of the openings of the apertures in the upper part of the resist pattern 17.

Figure 14A:
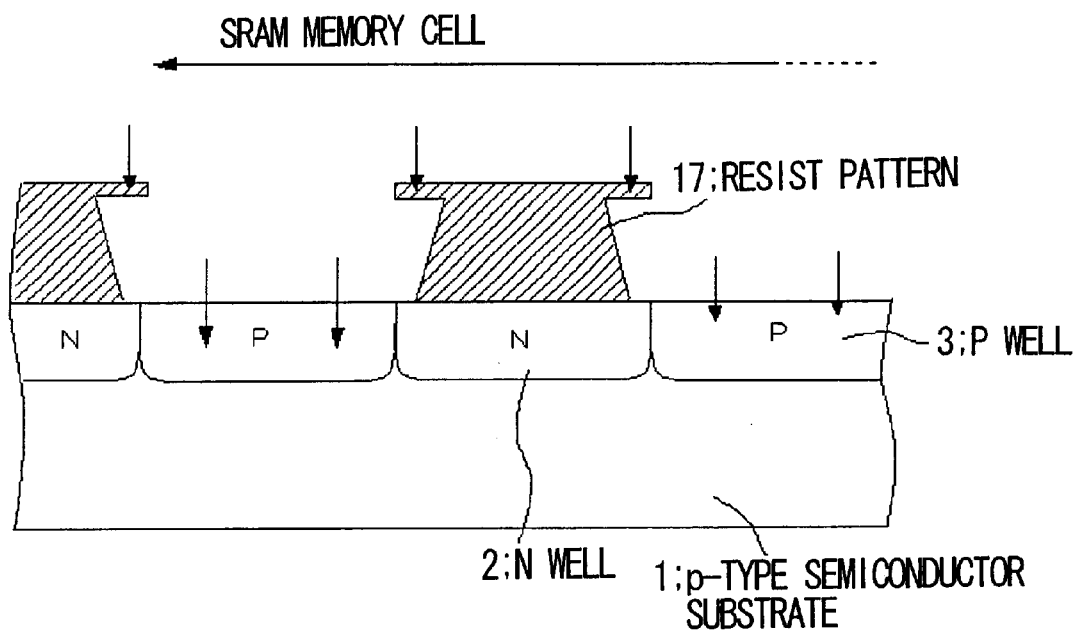
FIGS. 14(a)–14(b) are process sectional views schematically illustrating part of a method of manufacturing a semiconductor memory device according to a fifth embodiment of the present invention.
Figure 14B:
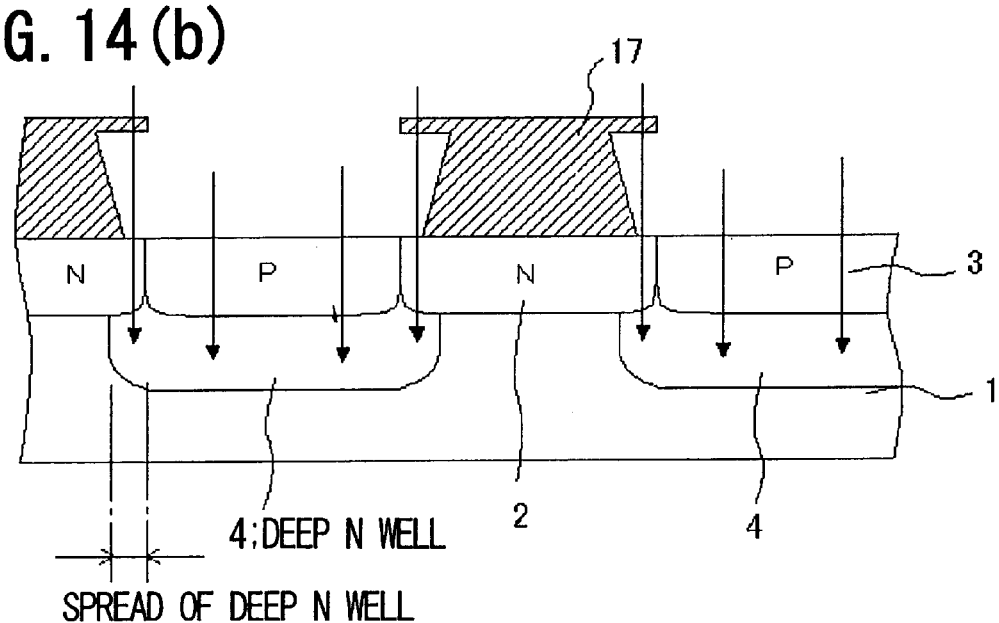

Next, phosphorous serving as an n-type impurity is injected to form the deep n well 4 using the same resist pattern 17, as shown at (b) of FIG. 14. Since the phosphorous ion energy is high in this injection step, some of the ions that impinge upon the canopy portion at the end of the aperture in the resist pattern 17 pass through the resist pattern 17 and are injected into the p-type semiconductor substrate 1 underlying the resist pattern.

Accordingly, as in the foregoing embodiments, the additional injection of ions for the p well 3 and the injection of ions for the deep n well 4 can be carried out even though the same resist pattern 17 is used, thereby making it possible to eliminate a resist-pattern formation step. Further, in the memory cell of a loadless 4-transistor SRAM, the reference potential can be set to an optimum value by the externally provided negative-voltage generating circuit 30, as a result of which the data in the memory cell can be retained reliably. With regard to semiconductor memory devices in general, there is no increase in the effective thickness of the n well, thus making it possible to mitigate the effects of soft error in the n well region.

Figure 15A:
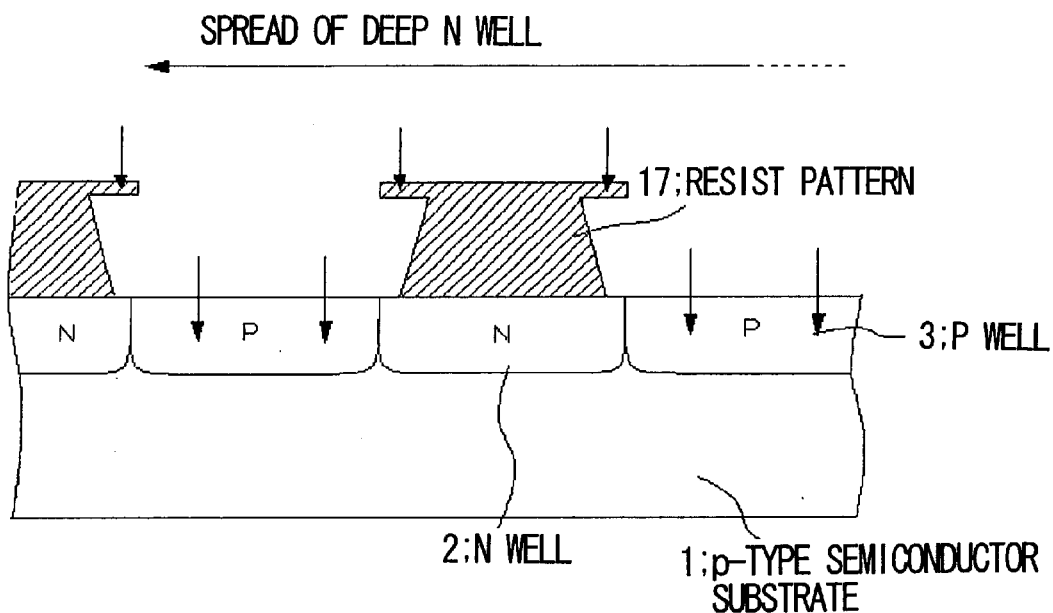
FIGS. 15(a)–15(b) are process sectional views schematically illustrating part of the method of manufacturing the semiconductor memory device according to the fifth embodiment of the present invention.
Figure 15B:
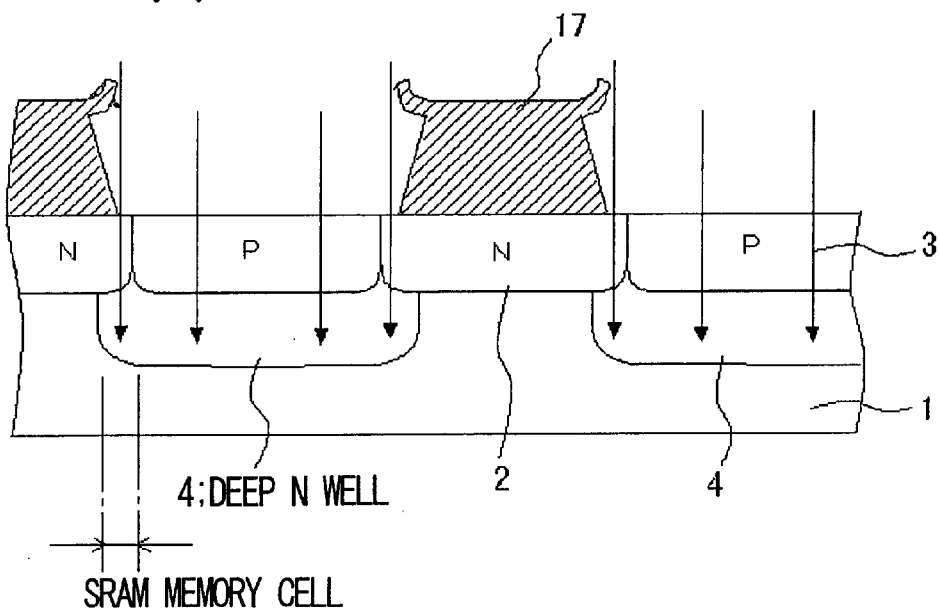
Figure 16:
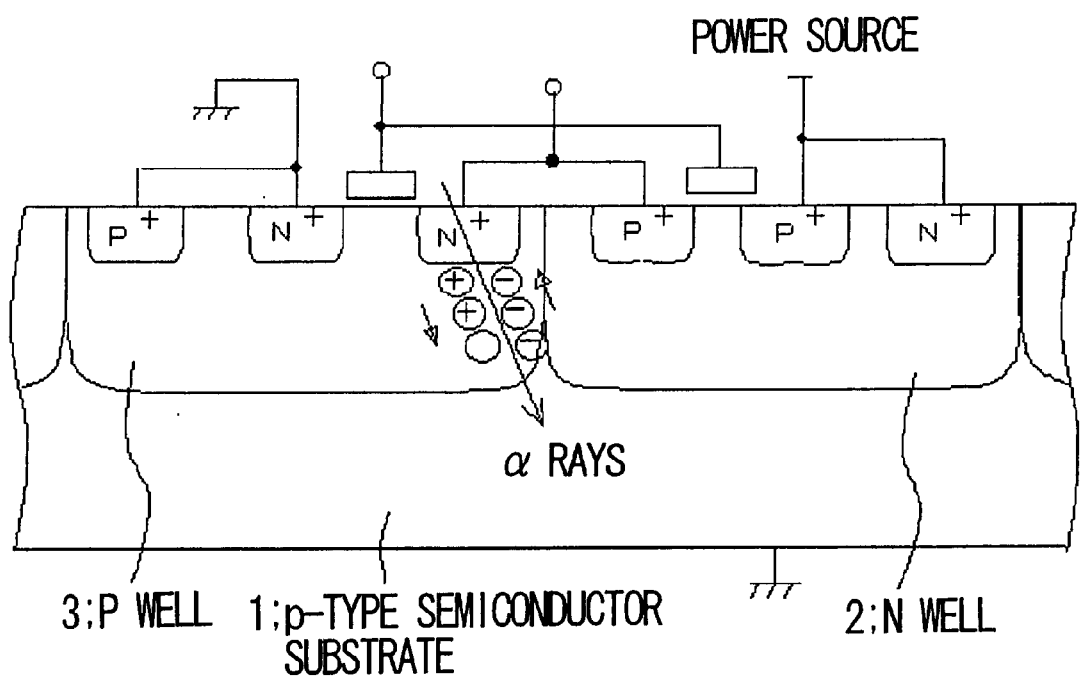
FIG. 16 is a sectional view schematically illustrating problems which arise with a semiconductor memory device according to the prior art.

Further, by employing the resist pattern having a shape in accordance with this embodiment, joint use can be made of a method of changing the ion injection angle described in the third embodiment. As a result, the thickness of the deep n well 4 can be changed at will. Further, when the resist pattern having the canopy shape is formed, the thickness of the canopy and the amount of projection thereof can be adjusted by adjusting the immersion time in the agent. For example, in a case where the canopy has been formed to have reduced thickness, as shown in FIG. 15(a), the temperature of the resist layer rises owing to ion injection at formation of the deep n well 4, whereby the resist constituting the canopy can be made to deform intentionally. When this occurs, the aperture in the resist pattern broadens, as shown in FIG. 15(b) This makes it possible to enlarge the ion injection area in reliable fashion.

It should be noted that the present invention is not limited to the foregoing embodiments. For example, the to a MIS (Metal Insulator Semiconductor) transistor adapted to use a nitride or a double layer structured film of an oxide or nitride instead of a single layer of oxide.

Further, the conductivity type of the semiconductor substrate or the conductivity type of each semiconductor may be reversed, with the n type becoming the p type and vice versa. In other words, the driving MOS transistor may be constituted by a p-type MOS transistor and the address-selecting MOS transistor may be constituted by an n-type MOS transistor. In such case it is so arranged that the output node of the driving MOS transistor is maintained at the ground potential in order to retain the data of the memory cell. Further, the method or step for setting the threshold voltage value of the MOS transistor is not limited to the conditions indicated in the embodiments and can be changed as necessary.

The meritorious effects of the present invention are summarized as follows.

Thus, in accordance with the present invention, as described above, adjustment of the impurity concentration of the p well in a memory cell and formation of a deep n well can be carried out with a single resist pattern. As a result, it is possible to eliminate a PR step for forming a deep n well for the purpose of preventing soft error caused by gamma rays entrant from the outside.

The reason for this is that since the effective thickness of the resist along the direction of ion injection can be reduced in the vicinity of the apertures by forming the resist pattern to have a tapered shape, inverted tapered shape or canopy, the high-energy ions which form the deep n well are allowed to pass through the resist and can be injected into the substrate. In addition, by deciding the ion injection direction in dependence upon the process, the ion injection area can be changed.

Further, in accordance with the present invention, the reference potential of the p-well region of the memory cell can be control led freely in the case of a loadless 4-transistor SRAM. As a result, data that has been stored in the memory cell can be retained in reliable fashion.

The reason for this is that since the p-well region of the driving MOS transistor is isolated from the p-type semiconductor substrate by the deep n well, the threshold voltage value of the driving MOS transistor can readily be set to be larger than the threshold voltage value of the address-selecting MOS transistor by an externally provided negative-voltage generating circuit.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A loadless 4-transistor static random access memory (SRAM) device, including a memory cell portion and a peripheral circuit portion, comprising:
a semiconductor substrate of a first conductivity type on which said memory cell portion and said peripheral circuit portion are formed;
a first well of said first conductivity type including a pair of loadless driving transistors of a second conductivity type formed in said memory cell portion, where a channel region of each of said pair of loadless driving transistors includes a layer of injected impurities of a prescribed concentration for adjusting a threshold-voltage value;
a pair of address-selecting transistors of said first conductivity type formed in a second well of said second conductivity type in said memory portion; and
a deep well of said second conductivity type formed below said first well of said memory portion.

2. The loadless 4-transistor SRAM according to claim 1, wherein said first well of said first conductivity type is set to a reference potential by a voltage generating circuit, external to said loadless 4-transistor SRAM device.

3. The loadless 4-transistor SRAM device according to claim 1, wherein said pair of loadless driving transistors and said pair of address-selecting transistors comprise metal oxide semiconductor (MOS) transistors.

4. The loadless 4-transistor SRAM device according to claim 1, wherein said pair of loadless driving transistors and said pair of address-selecting transistors comprise metal insulator semiconductor (MIS) transistors.

5. A loadless 4-transistor SRAM device, including a memory cell portion and a peripheral circuit portion, comprising:
a semiconductor substrate of a first conductivity type on which said memory cell portion and said peripheral circuit portion are formed;
a first well of said first conductivity type including a pair of loadless driving transistors of a second conductivity type formed in said memory cell portion, where a channel region of each of said pair of loadless driving transistors includes a layer of injected impurities of a prescribed concentration for adjusting a threshold-voltage value;
a pair of address-selecting transistors of said first conductivity type formed in a second well of said second conductivity type in said memory portion; and
a deep well of said second conductivity type formed below at least said first well of said first conductivity type including said pair of loadless driving transistors so as to electrically isolate said first well of said first conductivity type from said semiconductor substrate.

6. The 4-transistor loadless SRAM device according to claim 2, wherein said first well of said first conductivity type is set to a reference potential by a voltage generating circuit, external to said loadless 4-transistor SRAM device.

7. The loadless 4-transistor SRAM device according to claim 5, wherein said pair of loadless driving transistors and said pair of address-selecting transistors comprise metal oxide semiconductor (MOS) transistors.

8. The loadless 4-transistor SRAM device according to claim 5, wherein said pair of loadless driving transistors and said pair of address-selecting transistors comprise metal insulator semiconductor (MIS) transistors.

9. A loadless SRAM device of a triple-well structure, comprising:
a semiconductor substrate of a first conductivity type on which a memory cell portion and a peripheral circuit portion are formed;
a first well of said first conductivity type that includes a pair of loadless driving transistors, is located in said memory cell portion, and has a higher impurity concentration than a second well of said first conductivity type located in said peripheral circuit portion;
a third well of a second conductivity type that includes a pair of address-selecting transistors and is located in said memory cell portion; and
a deep well of said second conductivity type formed below said memory portion covering only said first well of said first conductivity type in said memory cell portion.

10. The loadless SRAM device according to claim 9, wherein said deep well of said second conductivity type extends horizontally by about 0.1 $\mu$m or more beyond each lateral border of said first well of said first conductivity type when viewed in cross-section.

11. The loadless SRAM device according to claim 9, wherein said deep well of said second conductivity type extends horizontally by about 0.1 μm to about 1 μm beyond each lateral border of said first well of said first conductivity type when viewed in cross-section.

12. The loadless SRAM device according to claim 9, wherein said loadless SRAM device comprises a 4-transistor SRAM device.

13. The loadless SRAM device according to claim 9, wherein said first well of said first conductivity type is set to a reference potential by a voltage generating circuit, external to said loadless SRAM device.

14. The loadless SRAM device according to claim 9, wherein said pair of loadless driving transistors and said pair of address-selecting transistors comprise metal oxide semiconductor (MOS) transistors.

15. The loadless SRAM device according to claim 9, wherein said pair of loadless driving transistors and said pair of address-selecting transistors comprise metal insulator semiconductor (MIS) transistors.

16. A loadless 4-transistor static random access memory (SRAM) device, including a memory cell portion and a peripheral circuit portion, comprising:

a semiconductor substrate of a first conductivity type on which said memory cell portion and said peripheral circuit portion are formed;

a first well of said first conductivity type including a pair of loadless driving transistors of a second conductivity type formed in said memory cell portion;

a pair of address-selecting transistors of said first conductivity type formed in a second well of said second conductivity type in said memory portion; and a deep well of said second conductivity type formed below said first well, so that said first well of said first conductivity type of said memory portion is electrically isolated from said semiconductor substrate and is set to a reference potential by a voltage generating circuit, external to said loadless SRAM device.

17. The loadless 4-transistor SRAM device according to claim 16, wherein said deep well of said second conductivity type extends horizontally by about 0.1 μm or more beyond each lateral border of said first well of said first conductivity type when viewed in cross-section.

18. The loadless 4-transistor SRAM device according to claim 16, wherein said deep well of said second conductivity type extends horizontally by about 0.1 μm to about 1 μm beyond each lateral border of said first well of said first conductivity type when viewed in cross-section.

19. The loadless 4-transistor SRAM device according to claim 16, wherein said pair of loadless driving transistors and said pair of address-selecting transistors comprise metal oxide semiconductor (MOS) transistors.

20. The loadless 4-transistor SRAM device according to claim 16, wherein said pair of loadless driving transistors and said pair of address-selecting transistors comprise metal insulator semiconductor (MIS) transistors.

* * * * *